US006429443B1

(12) United States Patent
Mankos et al.

(10) Patent No.: US 6,429,443 B1
(45) Date of Patent: Aug. 6, 2002

(54) MULTIPLE BEAM ELECTRON BEAM LITHOGRAPHY SYSTEM

(75) Inventors: Marian Mankos, San Francisco; Steven T Coyle, Alameda; Andres Fernandez, Dublin; Tai-Hon P Chang, Foster City, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/589,029

(22) Filed: Jun. 6, 2000

(51) Int. Cl.[7] .......................... H01J 37/075; G21K 5/00
(52) U.S. Cl. ............................. 250/492.24; 250/492.1; 250/492.2
(58) Field of Search ................. 250/492.1, 492.2, 250/214 LS, 492.24; 372/45

(56) References Cited

U.S. PATENT DOCUMENTS

| 4,820,927 A | 4/1989 | Langner et al. .......... 250/492.2 |
| 5,039,862 A | 8/1991 | Smith et al. ............. 250/432 P |
| 5,386,221 A | 1/1995 | Allen et al. .................. 346/108 |
| 5,432,809 A | 7/1995 | Grodzinski et al. ........... 372/45 |
| 5,684,360 A | 11/1997 | Baum et al. ................. 313/542 |
| 5,812,571 A | 9/1998 | Peters ......................... 372/36 |
| 5,905,267 A | 5/1999 | Muraki .................. 250/492.22 |

OTHER PUBLICATIONS

"Pages from EMCORE Corp's Website," Jan. 6, 2000.
"Pages from the Swiss Center of Electronics and Microtechnologies (CSEM) Website," Jan. 6, 2000.
"Product Information Parallel Datacom, Telecom," Jan. 13, 1999.
"Using the IPD Series Photon Detector", Aug. 1998.

Primary Examiner—John R. Lee
Assistant Examiner—David Vanore
(74) Attorney, Agent, or Firm—Jung-hua Kuo

(57) ABSTRACT

Multiple beam electron beam lithography uses an array of vertical cavity surface emitting lasers (VCSELS) to generate laser beams, which are then converted to electron beams using a photocathode. The electron beams are scanned across a semiconductor substrate or lithography mask to imprint a pattern thereon. The use of VCSELs simplifies the design of the electron beam column and improves the throughput and writing resolution of the lithography system.

9 Claims, 5 Drawing Sheets

MULTIPLE BEAM ELECTRON BEAM LITHOGRAPHY SYSTEM

BACKGROUND OF THE INVENTION

1. Field of the Invention

The present invention generally relates to the manufacture of semiconductor devices and more particularly to multiple beam electron beam lithography.

2. Description of the Related Art

Lithography systems are used for creating patterns, such as features of an electronic circuit, on a semiconductor substrate. In one type of suggested electron beam lithography system, a light beam from a light source is demagnified and focused on a photocathode, which then converts the light beam into an electron beam (see, for example, U.S. Pat. No. 4,820,927 to Langner et al.). By modulating the light source and by scanning the electron beam using an electron optics, a desired pattern can be written on a mask blank (for later photolithography) or directly on a semiconductor substrate (direct-write lithography). In this disclosure, the term "writing plane" includes semiconductor substrates, lithography mask blanks, and like workpieces.

A multiple beam electron beam lithography system ("multi-beam system") works similarly as described above except that multiple light sources are employed (see, for example, U.S. Pat. No. 5,039,862 to Smith et al. and U.S. Pat. No. 5,684,360 to Baum et al.). The light sources are typically arranged in an array and individually modulated to create the pattern. The placement of the light sources relative to one another in the array is critical in a multi-beam system because a light source placement error directly translates to an electron beam writing error. In the fabrication of 0.1 micrometer devices, for example, electron beam writing errors less than 10 nm are required. Further, the rate at which the light sources are modulated to create the pattern affects the throughput of the multi-beam system. It is desirable to increase the modulation rate of the light sources to achieve a corresponding increase in the number of writing planes that can be processed.

The photocathode and electron optics of a multi-beam system are typically contained in an evacuated electron beam column. It is desirable to shorten the length of the column to reduce interaction between electrons ("electron-electron interaction") in an electron beam. Electron-electron interaction blurs the electron beam, thereby degrading the resolution of the pattern written on the writing plane. It is also desirable to shorten the length of the column to simplify its design.

SUMMARY

The present invention relates to a multiple beam electron beam lithography system. In one embodiment, an array of vertical cavity surface emitting lasers (VCSELs) generates laser beams, which are then converted to electron beams using a photocathode. The electron beams are scanned across a writing plane to image a pattern thereon. The VCSELs are electronically modulated using circuitry located outside the electron beam column. The use of VCSELs simplifies the design of the electron beam column and improves the writing resolution and throughput of the lithography system.

Other features and advantages of the present invention will be apparent to one of ordinary skill in the art upon reading the following description, figures, and claims.

BRIEF DESCRIPTION OF THE DRAWINGS

The use of the same reference numerals in different figures indicates the same or like elements.

DETAILED DESCRIPTION

Figure 1A:
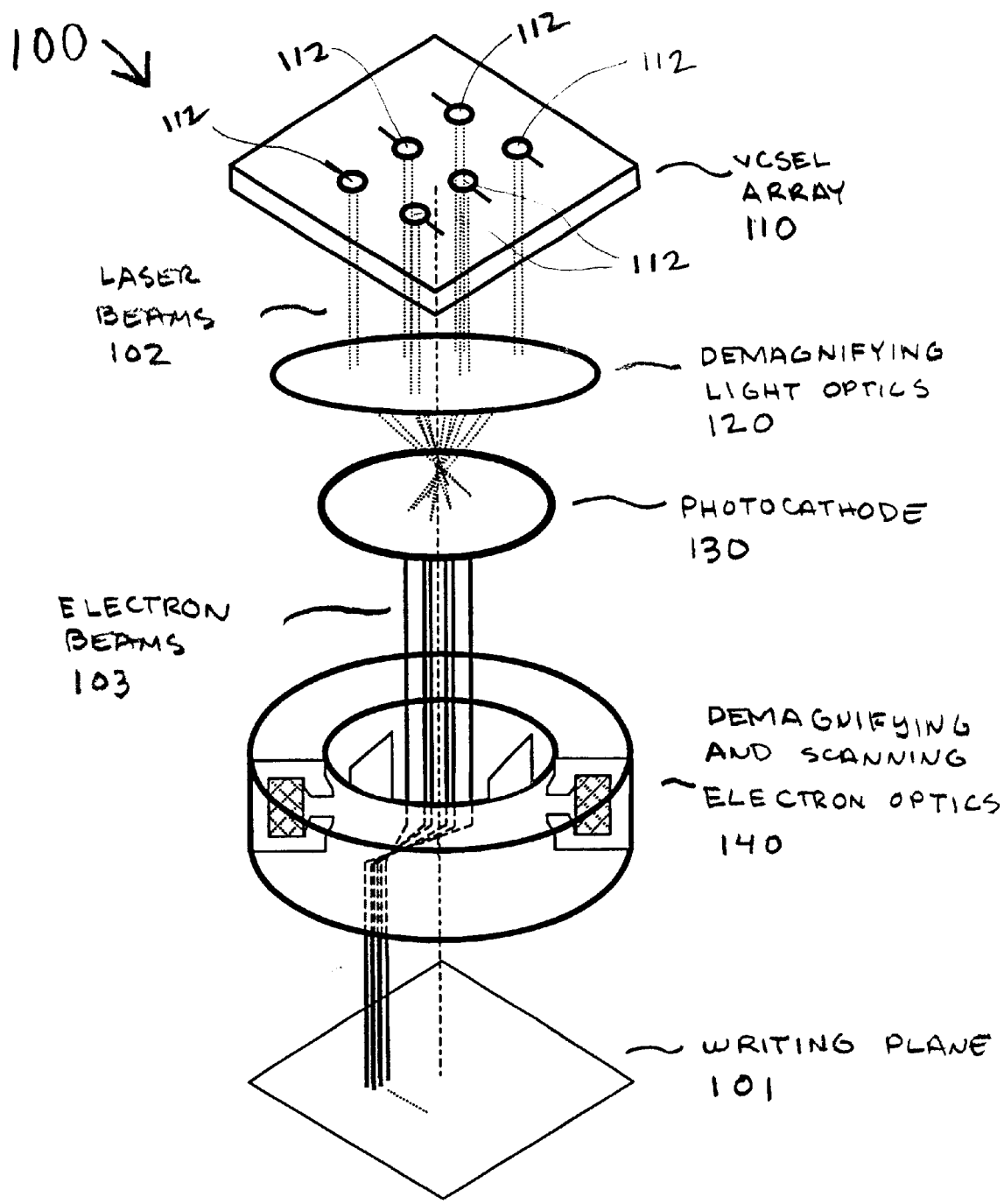
FIGS. 1A and 1B are schematic diagrams of a lithography system in accordance with an embodiment of the invention.
Figure 1B:
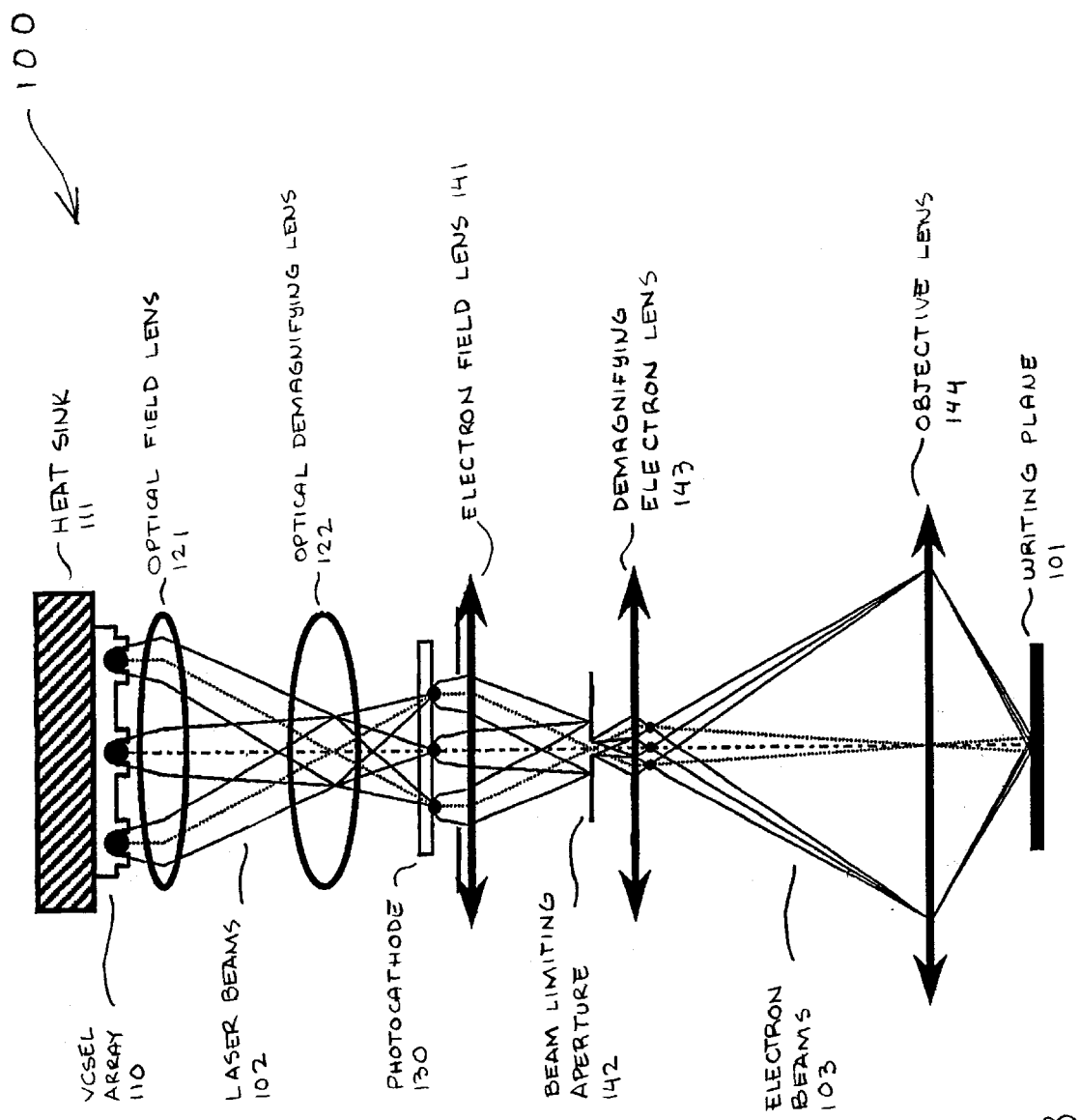
Figure 2A:
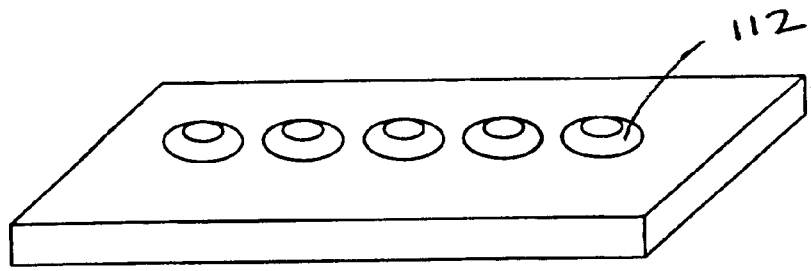
FIGS. 2A, 2B, and 2C are perspective views of VCSEL arrays.
Figure 2B:
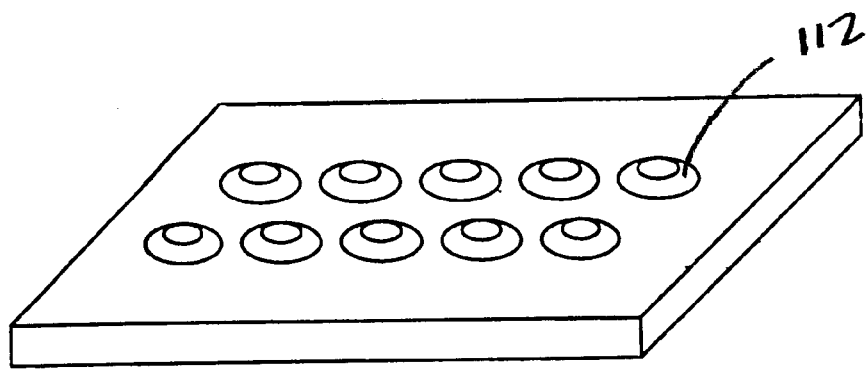
Figure 2C:
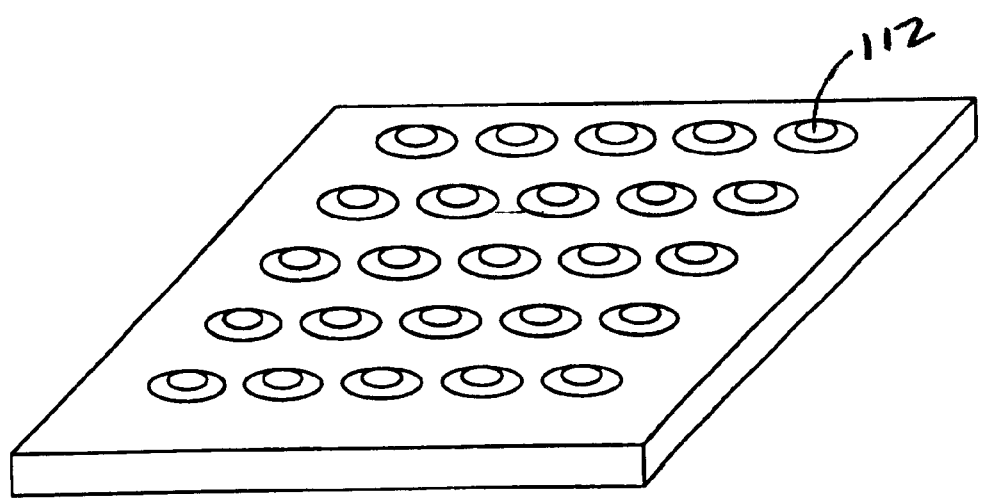

FIGS. 1A and 1B show schematic diagrams of an electron beam lithography system 100 in accordance with an embodiment of the invention. Throughout this disclosure, components that are well known and not necessary to the understanding of the invention are omitted in the discussions and the figures in the interest of clarity. As shown in FIG. 1A, multiple vertical cavity surface emitting lasers (VCSELs) 112 are formed in a VCSEL array 110 for generating laser beams 102. VCSELs are semiconductor lasers that have epitaxially-grown Bragg mirrors forming a cavity. Laser beams are emitted vertically from the surface of the semiconductor substrate on which the VCSELs are fabricated. VCSELs, in general, are well known; for example, see U.S. Pat. No. 5,432,809 to Grodzinski et al. and U.S. Pat. No. 5,812,571 to Peters, both of which are incorporated herein by reference in their entirety. VCSELs are commercially available from Mitel Semiconductor of Canada (mitelsemi.com), Emcore Corporation of Somerset, N.J. (emcore.com), and Swiss Center of Electronics and Microtechnologies ("CSEM") of Switzerland (csem.ch). Conventional VCSELs can be used in the present invention. VCSELs 112 can be arranged in a line (see FIG. 2A), a rectangular (see FIG. 2B), or a square (see FIG. 2C) array. Individual VCSELs 112 can be precisely sized and placed (e.g., to within several tenths of nanometers) in the array by fabricating VCSEL array 110 using conventional semiconductor device fabrication techniques or MicroElectro-Mechanical Systems (MEMS) technology. Accurate placement of each VCSEL 112 relative to other VCSEL 112 in the array provides for electron beam writing errors that are less than 10 nm.

Figure 3:
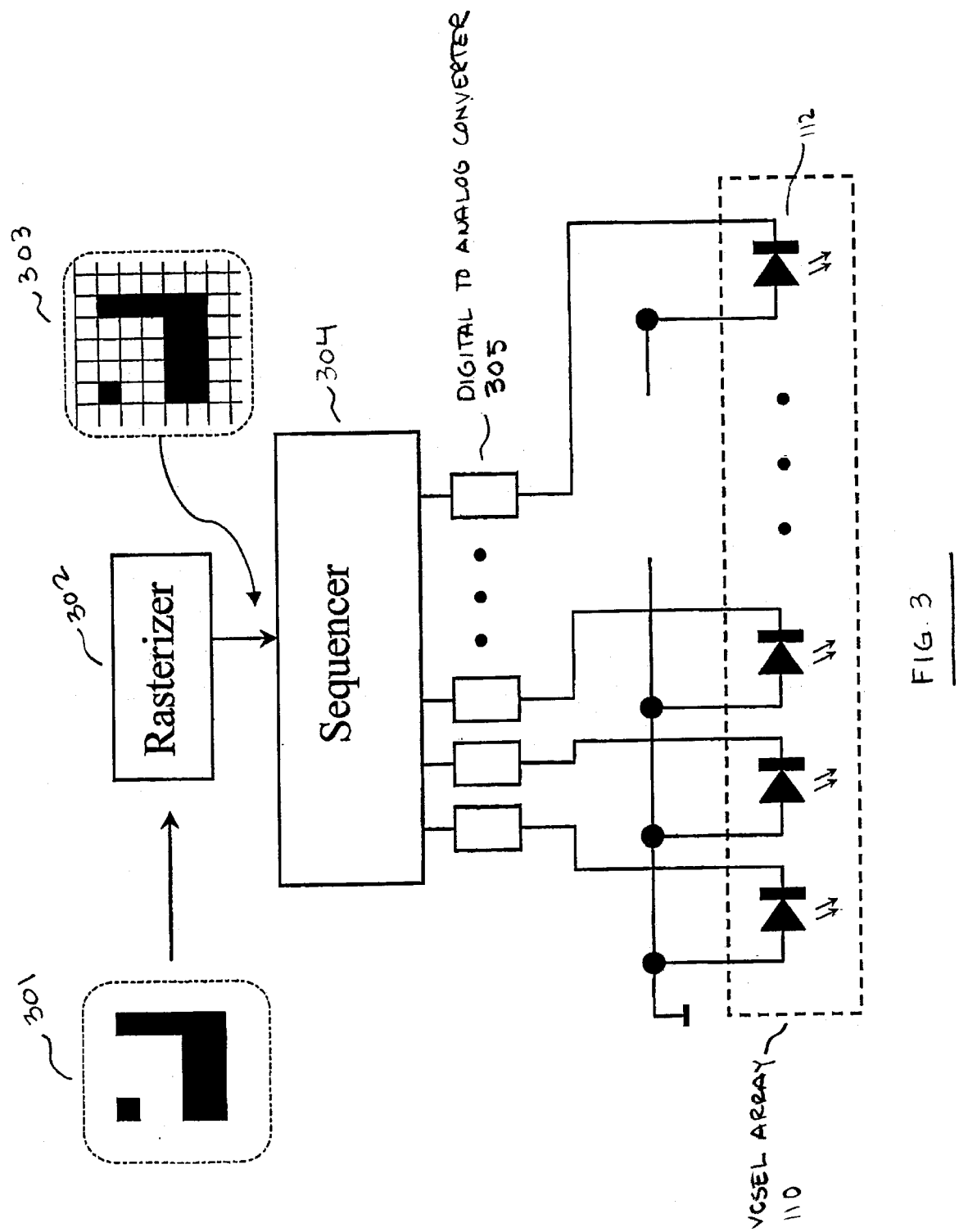
FIG. 3 shows a schematic diagram of an electronic modulator for a VCSEL array.

In FIG. 1A, photocathode 130 and demagnifying and scanning electron optics 140 ("electron optics 140") are contained in an evacuated electron beam column. In lithography system 100, the length of the column is minimized by electronically modulating VCSELs 112 using circuitry located outside the column. This is in marked contrast with columns in the prior art that use internal deflectors and apertures for blanking. Electronic modulation of VCSELs 112 simplifies the design of the column and improves writing resolution by minimizing electron-electron interaction. Further, VCSELs 112 can be electronically modulated at a rate greater than one giga Hertz (GHz), thereby improving the throughput of lithography system 100. FIG. 3 shows a schematic diagram illustrating the electronic modulation of VCSELs 112 in one embodiment of the invention. Pattern 301, the pattern to be written on the writing plane, is conventionally converted into a pixel map 303 by a rasterizer 302. Pixel map 303 contains, among other information, the location where each pixel of pattern 301 is to be written on the writing plane. Based on information from pixel map 303, a sequencer 304 then determines the VCSELs 112 that need to be enabled at the appropriate time to obtain the desired pattern. To modulate the intensity of the photons emitted by VCSELs 112, sequencer 304 applies a DC (direct-current) voltage on each VCSEL 112 using digital to analog converters (DAC) 305. The photon intensity can be finely modulated by applying a DC voltage level that is between the switch-ON (i.e. a voltage level which switches a VCSEL completely ON) and switch-OFF (i.e. a voltage level which switches a VCSEL completely OFF) gate bias threshold voltages of VCSELs 112. Fine modulation of photon intensity allows pattern 301 to be written on writing plane 101 using a multiple gray level multiple pass writing technique; for example, see U.S. Pat. Nos. 5,386,221, 5,393, 987, 5,533,170, and 6,037,967, all of which are incorporated herein by reference. The multiple gray level multiple pass writing technique can also be employed by varying the length of the modulation pulse applied on each VCSEL 112.

Figure 4:
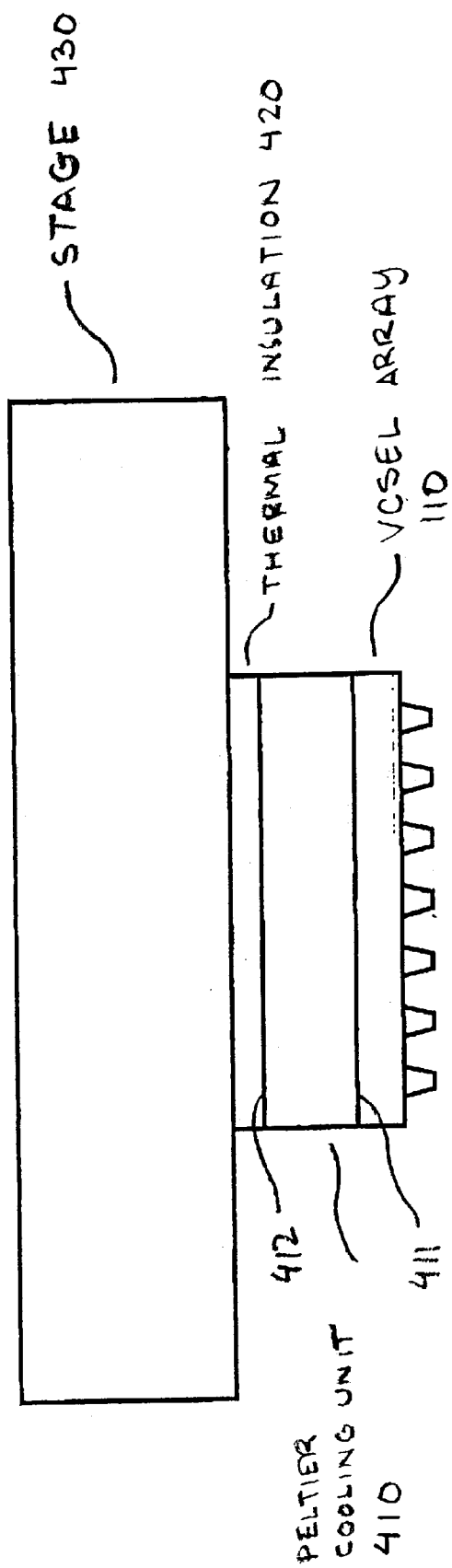
FIG. 4 is a schematic diagram illustrating the use of an active cooling unit to cool a VCSEL array.

FIG. 4 shows a schematic diagram illustrating the cooling of VCSEL array 110 in one embodiment of the invention. As shown in FIG. 4, a Peltier cooling unit 410 actively cools VCSEL array 110 to prevent thermal drift. Peltier cooling units are well known. Peltier cooling unit 410 includes side surfaces 411 and 412. The temperature difference between side surfaces 411 and 412 is related to the DC current being provided to Peltier cooling unit 410. By controlling the magnitude and direction of the DC current, side surface 411 can be made cooler than side surface 412. This allows active cooling of VCSEL array 110, which contacts side surface 411. Of course, this also results in side surface 412 being warmer than side surface 411. A thermal insulation plate 420 is thus provided to thermally isolate side surface 412 from a conventional positioning stage 430, which allows VCSEL array 110 to be adjusted for mechanical alignment. Alternatively, a heat sink 111 can be used to dissipate heat from VCSEL array 110 as shown in FIG. 1B.

VCSELs are primarily used to generate signals that convey information in data communication, telecommunication, and sensor applications. While laser diodes and gas lasers have been suggested as light sources in an electron beam lithography system, such lasers typically require a modulator in the path of the laser beam, thereby increasing the overall complexity of the electron beam lithography system. In the present invention, an in-line modulator is not required because VCSELs 112 are electronically modulated using circuitry located outside the column. Further, VCSELs 112 have smaller dimensions and lower power dissipation than conventional lasers suggested for electron beam lithography systems in the prior art.

Referring back to FIG. 1A, the laser beams 102 generated by VCSEL array 110 are demagnified and focused on the backside of a photocathode 130 using a demagnifying light optics 120. Photons of laser beams 102 excite electrons in photocathode 130 above the vacuum level. Excited electrons that do not lose enough energy while scattering in photocathode 130 are emitted into vacuum as electron beams 103 and conventionally accelerated towards writing plane 101. A variety of photocathodes can be used with the invention including negative electron affinity (NEA) photocathodes, cesium-tellurium (CsTe) photocathodes, and silicon-cesium oxide nanoclusters. NEA photocathodes are commercially available from Intevac, Inc. of Santa Clara, Calif. and are described in U.S. Pat. No. 5,684,360 to Baum et al., incorporated herein by reference in its entirety. CsTe photocathodes require a VCSEL 112 with a relatively short wavelength (e.g., about 300 nm) while NEA photocathodes require a VCSEL 112 with a relatively long wavelength (e.g., about 700 nm). Electron beams 103 that are emitted from photocathode 130 are demagnified and scanned across writing plane 101 using a demagnifying and scanning electron optics 140.

FIG. 1B schematically shows further details of lithography system 100. Demagnifying light optics 120 (FIG. 1A) is shown in FIG. 1B as including an optical field lens 121 and an optical demagnifying lens 122. Optical field lens 121 focuses the divergent laser beams from VCSEL array 110 onto the optical demagnifying lens 122, which in turn demagnifies the laser beams for striking the photosensitive backside of photocathode 130.

In FIG. 1B, demagnifying and scanning electron optics 140 (FIG. 1A) is shown as including an electron field lens 141, a beam limiting aperture 142, a demagnifying electron lens 143, and an objective lens 144. As is known in the art, an electron optics includes magnetic (e.g., coils, pole pieces, yokes) and electrostatic components for influencing an electron beam. Divergent electron beams that are emitted from photocathode 130 are focused onto a beam limiting aperture 142. Electron beams passing through beam limiting aperture 142 are demagnified by demagnifying electron lens 143 before being focused onto writing plane 101 using objective lens 144. The present invention can also be implemented using the light and electron optics/lenses disclosed in commonly-assigned U.S. Patent Application, "Compact Photoemission Source, Field And Objective Lens Arrangement For High Throughput Electron Beam Lithography," Ser. No. 09/272,086, filed on Mar. 18, 1999, incorporated herein by reference in its entirety.

While the invention is described using specific examples, the invention is not so limited and may be practiced using alternative techniques which are readily apparent to one of ordinary skill in the art reading this disclosure. The scope of the present invention is set forth in the following claims.

What is claimed is:

1. A multiple beam electron beam lithography system comprising:

a plurality of vertical cavity surface emitting lasers (VCSELs), said plurality of VCSELs being operable to generate a plurality of laser beams;

a photocathode for converting said plurality of laser beams into a plurality of electron beams; and a writing plane in the path of said plurality of electron beams.

2. The system of claim 1 further comprising:

light optics between said plurality of VCSELs and said photocathode, wherein said plurality of laser beams from said plurality of VCSELs are demagnified and focused on said photocathode by said light optics; and electron optics between said photocathode and said writing plane, wherein said plurality of electron beams from said photocathode are demagnified and scanned on said writing plane by said electron optics.

3. The system of claim 1 wherein said writing plane is a semiconductor substrate.

4. The system of claim 1 wherein said writing plane is a lithography mask blank.

5. The system of claim 1 further comprising an electronic modulator coupled to modulate said plurality of VCSELs.

6. The system of claim 1 wherein said photocathode is selected from a group consisting of negative electron affinity (NEA) photocathodes, cesium-tellurium (CsTe) photocathodes, and silicon-cesium oxide nanoclusters.

7. The system of claim 1 wherein said plurality of VCSELs are in an array.

8. In an electron beam lithography system, a meth for writing a pattern on a writing plane, said method comprising the acts of:

using a vertical cavity surface emitting laser (VCSEL) to generate a laser beam;

converting said laser beam into an electron beam; and scanning said electron beam on said writing plane.

9. The method of claim 8 further comprising the act of electronically modulating said VCSEL.

* * * * *